(12) United States Patent
Barras et al.

(10) Patent No.: US 7,086,029 B1
(45) Date of Patent: Aug. 1, 2006

(54) INCREMENTAL DESIGN USING A GROUP AREA DESIGNATION

(75) Inventors: Arne S. Barras, Longmont, CO (US); Jeffrey M. Mason, Eldorado Springs, CO (US); Kate L. Kelley, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 400 days.

(21) Appl. No.: 10/370,329

(22) Filed: Feb. 18, 2003

Related U.S. Application Data

(60) Provisional application No. 60/438,410, filed on Jan. 6, 2003.

(51) Int. Cl.
*G06F 17/50* (2006.01)
(52) U.S. Cl. .................... 716/17; 716/5
(58) Field of Classification Search ............ 716/17–18, 716/2, 5, 7
See application file for complete search history.

(56) References Cited

U.S. PATENT DOCUMENTS

| | | | | |
|---|---|---|---|---|
| 5,394,030 A | * | 2/1995 | Jennings et al. ............... | 326/41 |
| 5,867,396 A | * | 2/1999 | Parlour ........................ | 716/18 |
| 6,799,309 B1 | * | 9/2004 | Dhanwada et al. ............ | 716/8 |
| 6,910,200 B1 | * | 6/2005 | Aubel et al. ................... | 716/9 |

* cited by examiner

*Primary Examiner*—Stacy A. Whitmore
(74) *Attorney, Agent, or Firm*—W. Eric Webostad; LeRoy D. Maunu

(57) ABSTRACT

Method and apparatus for incremental design is described. More particularly, a text-circuit description of the integrated circuit having logic groups of respective logic instances is obtained. Area groups are created for the logic groups and correspondingly assigned. Unchanged logic groups are guided on an incremental implementation from existing guide files, and changed logic groups are re-implemented in area groups corresponding to the changed logic groups. In this manner, runtime of the unchanged logic groups is reduced by an incremental guide implementation instead of a re-implementation, while performance of such unchanged logic groups is maintained from a prior implementation. Furthermore, degrees of freedom for re-implementing are enhanced for improving a design, as all prior mapping, placing and routing within a changed area group may be stripped for re-implementation.

11 Claims, 8 Drawing Sheets

INCREMENTAL DESIGN USING A GROUP AREA DESIGNATION

FIELD OF THE INVENTION

One or more aspects of the invention generally relate to incremental design, and more particularly to hierarchical and area-based guiding for incremental design.

BACKGROUND OF THE INVENTION

Programmable logic devices (PLDS) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, called a field programmable gate array (FPGA), is very popular because of a superior combination of capacity, flexibility, time-to-market, and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBs, IOBs, and interconnect structure are configured. The configuration bitstream may be read from an external memory, conventionally an external integrated circuit memory EEPROM, EPROM, PROM, and the like, though other types of memory may be used. The collective states of the individual memory cells then determine the function of the FPGA.

Conventionally, such a bitstream is generated using a hardware description language ("HDL"), such as Verilog or Very High Speed Integrated Circuit ("VHSIC") HDL ("VHDL"), to provide a textual description of circuitry ("text-circuit description") which is synthesized and implemented. Accordingly, a design described through an HDL is a functional description, which is converted into a text-circuit description using one or more synthesizer tools or programs. Mapping, placement, and routing of components/signals then implement this synthesis from which comes the bitstream. Due to the large number of components and interconnections, mapping, placing and routing can consume a significant amount of computer time ("runtime"). A more recent addition to HDL involves use of a programming language, such C/C++ as in SystemC from Synopsys of Mountain View, Calif., to provide a circuit synthesis.

Circuit synthesis is used in designing all types of complex integrated circuits. One use is for designing hardwired circuitry, such as in FPGAs, processors, Application Specific Standard Products (ASSPs), and the like. Another use is for designing Application Specific Integrated Circuits (ASICs), including ASIC standard cells, where a vendor or customer uses synthesis tools to programmatically configure logic built on such an integrated circuit. Another use of synthesis tools is programmatically configuring a portion of an FPGA to provide a design. For purposes of clarity, an FPGA integrated circuit is described, though it will be apparent that any integrated circuit of sufficient complexity designable with synthesis tools may be implemented.

Once a design is created and implemented for an FPGA, it may be improved for performance, debugged, or the like. The process for creating a design for an FPGA, or other circuit, can involve iterative use of synthesizing and implementing. This iterative process is sometimes referred to as "incremental design," and is described in additional detail in U.S. Pat. No. 5,867,396. Whether an FPGA design is being altered after meeting all timing requirements to improve performance, or is being changed to improve performance to meet all timing requirements, or other goal(s), rerunning a mapper ("MAP program"), and a placer and router ("PAR program") after each design change is time consuming. Thus, runtimes for mapping, placing and routing for implementation may significantly impact design cycle time, especially if multiple debugging iterations are done.

In incremental design of the past, if there were some percentage of change in instances of circuitry as coded, whether Verilog modules or VHDL entities for example, all unchanged circuitry would be left without any further mapping, placing and routing ("locked down"). The changed circuitry could then be re-mapped, re-placed and re-routed subject to avoidance of locked down circuitry. Classically, there was no differentiation with respect to hierarchy of logic, this was a flat instance "name-based" guide for incremental design. By "name-based," it is meant a matching or comparison of specific names used.

In U.S. Pat. No. 5,867,396, it was recognized that sometimes using name changes in a synthesis output ("netlist") as an indicator as to circuit changes in a design could be misleading. Thus, in instances of logic a name may be changed without actually having a corresponding change in circuitry from a prior naming. Accordingly, a check was made to determine whether a change in name actually amounted to a change in circuitry to potentially reduce the amount of circuitry to be re-mapped, re-placed and re-routed.

However, each of the above-described types of incremental design tends to be disfavored owing to inability to meet performance goals. Thus, conventional incremental design re-maps, re-places and re-routes an entire design in order to meet integrated circuit performance goals at the expense of runtime. Thus, multiple debugging iterations can significantly impact design cycle time. Furthermore, as integrated circuits become more complex by having more circuits, runtimes may increase.

Today, there is hierarchical synthesis. Hierarchical synthesis allows for multiple groupings of blocks of logic. Examples of hierarchical design methodologies, include:
  Having all critical paths within a grouping of instantiated logic.
  Having inputs or outputs (I/Os) registered at boundaries of a grouping of instantiated logic.
  Having a top hierarchical level ("top level") having only instantiated modules or entities, IOB logic and clock logic.

Accordingly, it would be both desirable and useful to provide means to reduced runtime for incremental design while doing a better job of facilitating meeting performance goals.

SUMMARY OF THE INVENTION

An aspect of the invention is a method for implementing incremental design change to a circuit design by: obtaining a text-circuit description of the circuit design having logic groups of logic instances; creating area groups for at least a portion of the hierarchical groupings of logic instances; assigning at least the portion of the hierarchical groupings of logic instances to the area groups; and generating at least one guide file having membership information of the logic group assignment to the area group.

Another aspect of the invention is a method for incremental design change to a circuit design. Reference logic instances and subsequent logic instances in an area group of the circuit design are obtained. The reference logic instances and the subsequent logic instances are compared with one another. In response to outcome of this comparison, logic instances are tagged to be either guided or re-implemented within the area group, where the tagging is for the guiding or the implementing of the area group in its entirety.

Another aspect of the invention is a method for incremental design change to a circuit design. Reference logic instances and subsequent logic instances in an area group of the circuit design are obtained. The reference logic instances and the subsequent logic instances are compared with one another. In response to outcome of this comparison, a selection of whether to implement or guide responsive to the reference logic instances and the subsequent logic instances being different or equivalent, respectively, is made.

Another aspect of the invention is a method for incrementally not modifying a circuit design of an integrated circuit. A plurality of logic groups is determined, and a plurality of area groups is created. A logic group of the plurality of logic groups is assigned to an area group of the plurality of area groups, where the logic group is an unmodified portion of the circuit design. Placement and routing for the logic group in the area group is maintained.

Another aspect of the invention is a method for incrementally modifying a circuit design of an integrated circuit. A plurality of logic groups is determined. A plurality of area groups is created. A logic group of the plurality of logic groups is assigned to an area group of the plurality of area groups. The logic group is replaced with a modified logic group, where the modified logic group is assigned to the area group.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

A circuit design for programming an FPGA as described below involves hierarchical design. This facilitates partitioning a design into "Area Groups" and "Logic Groups." Thus, an "incremental design change" may be made on a "nearly completed design" without significant additional map, place and route runtime.

An "Area Group" is a constraint on a design that packs logic together during a mapping processing. An "Area Group Range" constraint specifies a physical location in an FPGA for an Area Group. This physical location may be specified with x- and y-coordinates, among other coordinate systems.

MAP is a programmatic tool that, among other known actions, obtains target information (FPGA device, package and speed), reads an input file (conventionally created with Verilog or VHDL), maps pads and associated logic into IOBs, maps logic into FPGA components (such as CLBs and IOBs, among other known FPGA components), creates a physical constraint file, and generates a MAP report.

A "Logic Group" is a portion of a design that can be synthesized separately from other logic and can be assigned to an Area Group. A Logic Group thus conventionally may be a module in Verilog or an entity body in VHDL, or less conventionally a programming language description.

The phrase "incremental design change" refers to one or more changes in a design. Examples of incremental design changes may include changes to state machines or control logic, adding registers to improve performance, and the like. Thus, an incremental design change encompasses any change in circuitry or name in a design.

The phrase "nearly completed design" refers to a design that successfully runs through FPGA design implementation tools. Though timing requirements for such a design should already have been met, they need not have been met for a nearly completed design.

What follows at least in part is a detailed description of an incremental design flow that significantly decreases map, place and route runtime while preserving design performance of unchanged logic when making incremental design change to a nearly completed design.

Each Logic Group is constrained to occupancy of its own distinct space in an FPGA according to a corresponding Area Group, and thus there is a one-to-one correspondence between Area Groups and Logic Groups. When an incremental design change is made to a Logic Group, an incremental synthesis flow ensures that unchanged Logic Groups are not changed. Implementation tools re-map, re-place and re-route a changed Logic Group in its assigned Area Group, while unchanged Logic Groups are guided from a previous implementation. By guiding unchanged Logic Groups, performance of those unchanged Logic Groups is preserved, while map, place and route runtimes are decreased. This can significantly shorten design time when iterating a design.

Figure 1:
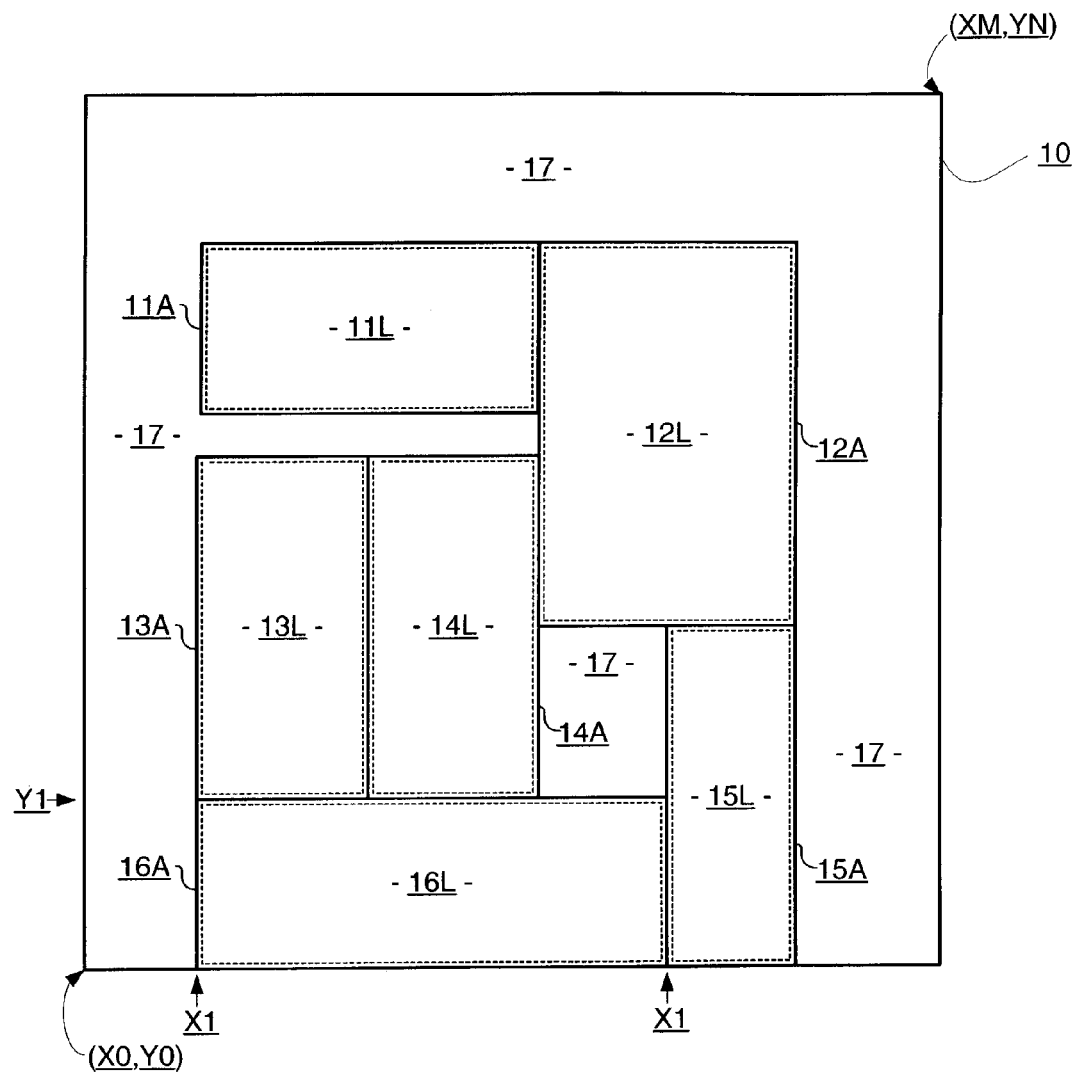
FIG. 1 is a high-level block diagram of an exemplary embodiment of an FPGA divided into Area Groups in accordance with one or more aspects of the invention.

FIG. 1 is a high-level block diagram of an exemplary embodiment of an FPGA 10 divided into Area Groups. Though FPGA 10 is divided into six Area Groups 11A, 12A, 13A, 14A, 15A, and 16A, fewer or more Area Groups may be used. While the invention is more suited to two or more Area Groups, it is possible to have only one Area Group that is a subset of the total area of the device, such as FPGA 10, where one or more ungrouped areas 17 are for unchanged logic. Area Groups 11A, 12A, 13A, 14A, 15A, and 16A are constrained to specific areas in FPGA 10. A range for each Area Group is specified in terms of x- and y-coordinates. So, for example, the range of FPGA 10 is from a starting point (X0,Y0) to an ending point (XM,YN) for M and N integers. Furthermore, (X0,Y0) to (XM,YN) may only range a portion of FPGA 10, such as when designing for an inserted core for a system-on-a-chip ("SoC"). So, for example, Area Group 16A may be designated by (X1,Y0) to (X2,Y1).

One or more instances of logic, such as modules or entities, may be in a Logic Group. Though there is a one-to-one correspondence between Logic Groups 11L, 12L, 13L, 14L, 15L, and 16L to respective Area Groups 11A, 12A, 13A, 14A, 15A, and 16A, there need not be such correspondence as one or more Logic Groups may be in an Area Group. Moreover, a Logic Group need not be assigned to an Area Group. However, for purposes of clarity, a design synthesis and implementation is described in terms of a one-to-one correspondence between Logic and Area Groups.

Placement of a Logic Group is anywhere in an Area Group. For example, Logic Group 11L is anywhere in, including up to the boundaries though a inset dashed-line is shown for Logic Groups, Area Group 11A. Accordingly, it should be understood that Area Group size and orientation (horizontal stacking, vertical stacking or otherwise) may vary, and that a Logic Group may be disposed anywhere within its Area Group taking up all or a portion of that specified area range. So, if Area Group range is adjusted for a smaller area, a Logic Group may have to be adjusted to stay in such an Area Group.

Figure 2:
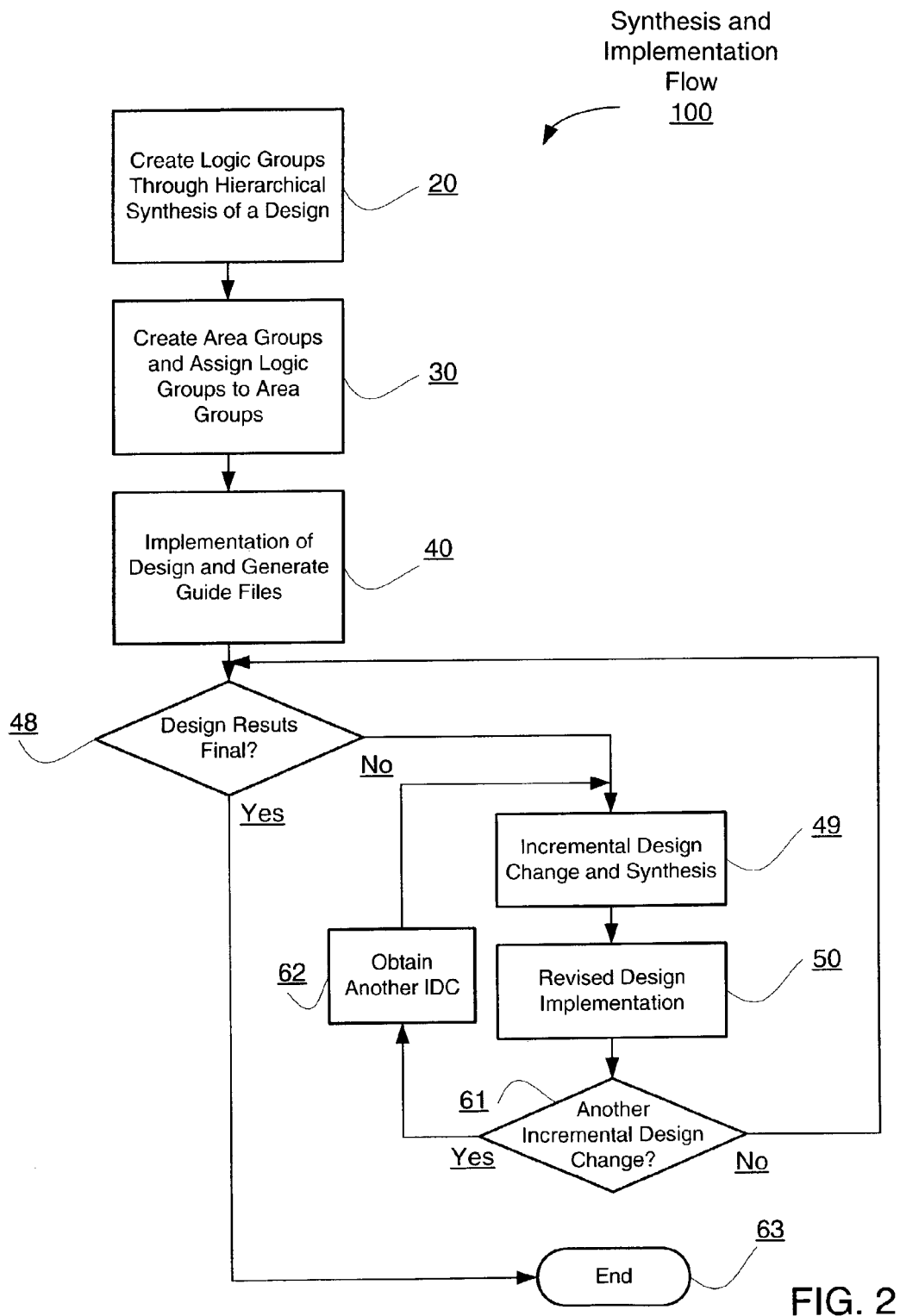
FIG. 2 is a high-level flow diagram of an exemplary embodiment of a synthesis and implementation flow in accordance with one or more aspects of the invention.

FIG. 2 is a high-level flow diagram of an exemplary embodiment of a synthesis and implementation flow 100. At 20, Logic Groups are created using a hierarchical synthesis of a user provided design. At 30, Area Groups are created and Logic Groups from block 20 are assigned to them.

Figure 3:
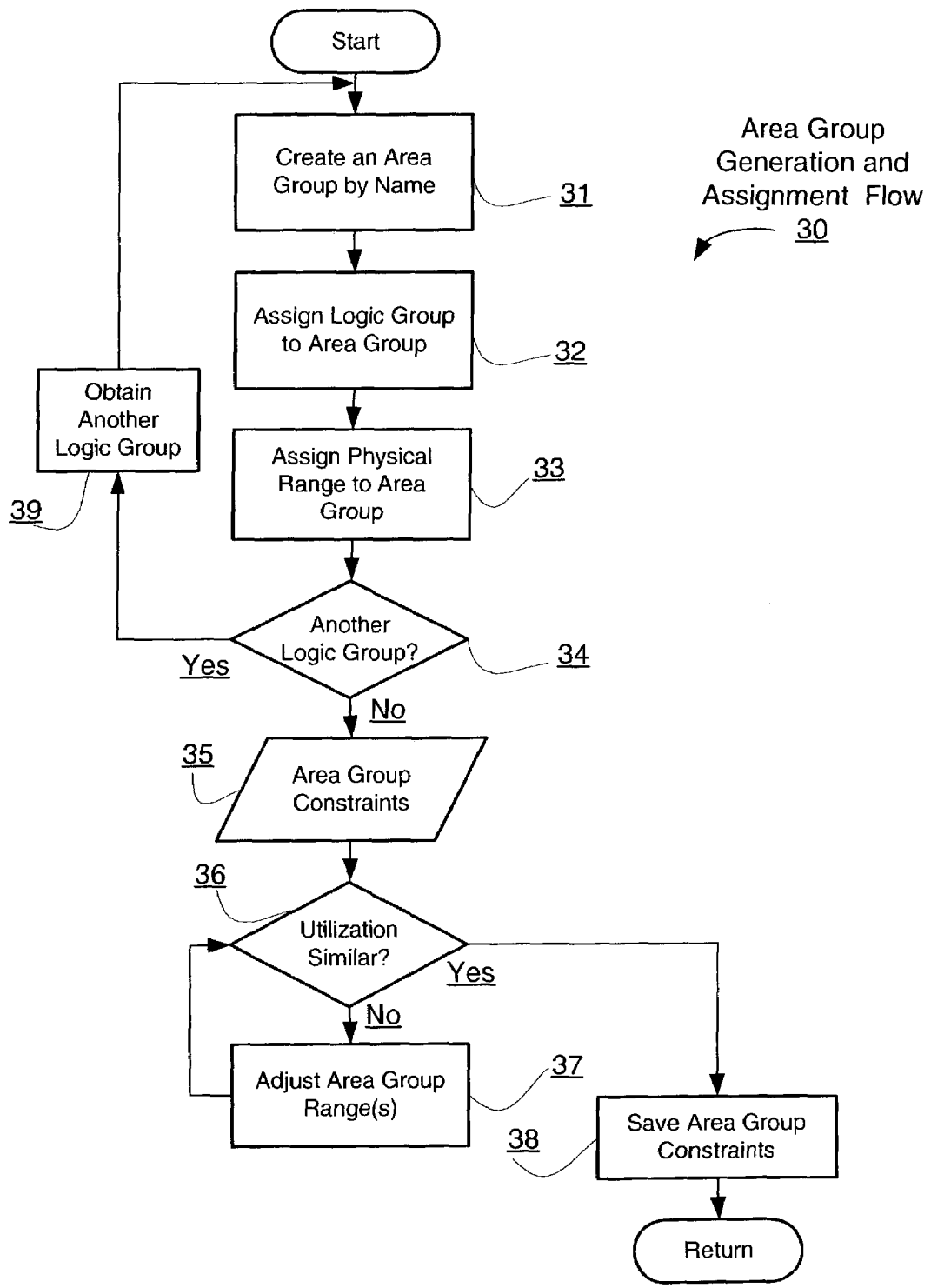
FIG. 3 is a flow diagram of an exemplary embodiment of an Area Group generation and assignment flow in accordance with one or more aspects of the invention.

FIG. 3 is a flow diagram of an exemplary embodiment of an Area Group generation and assignment flow 30. With continuing reference to FIG. 3 and renewed reference to FIG. 2, Area Group generation and assignment flow 30 is described in additional detail.

At 31, a name is created for an Area Group. At 32, a Logic Group from block 20 is assigned to the Area Group named at block 31 for this iteration. At 33, a physical range is assigned to the Area Group for this iteration. Thus, after block 33, area constraints for an Area Group have been generated. Notably, blocks 31 and 32 may be done in one step.

Area constraints may be influenced by other factors. For example, Area Groups, may, though should not overlap. Other guidelines for creating Area Groups are:

Area Groups that communicate with one another, need not, but should be placed proximal to one another.

Area Groups that communicate with I/Os, need not, but should be placed proximal to such I/Os.

I/Os that communicate with an Area Group, need not, but should be placed proximal to one another.

Resource utilization inside each Area Group, need not, but should be approximately the same percentage. With respect to FPGAs in particular, slice utilization inside each Area Group, need not, but should be approximately the same percentage—approximately within a spread of 20 percent, though larger deltas may be used.

At 34, a check is made as to whether there is another Logic Group to have an Area Group created and assigned. If another Area Group is to be created and assigned, another Logic Group from output of block 20 is obtained at 39.

At 35, constraints for Area Groups ("Area Group constraints") are output. Data output block 35 indicates that Area Group constraints may be output, and thus Area Group generation and assignment flow 30 can return to Synthesis and Implementation flow 100.

However, optionally at 36, utilization of Area Groups may be checked for being within an acceptance range. If, at 36, utilization is outside of an acceptance range, at 37 one or more Area Group ranges may be adjusted, after which utilization checking is repeated. If utilization is not within an acceptable distribution after adjustment, then Area Group generation and assignment flow 30 may be revisited to adjust such utilization. This may involve at least in part reassignment of one or more Logic Groups. A Pinout and Area Constraints Editor (PACE) from Xilinx of San Jose, Calif., may be used to create an Area Group, as described above.

Optionally, at 38, Area Group constraints are saved for later use. Notably, a designer may desire generating different sets of Area Group constraints for different incremental design iterations for comparison of results.

Referring again to FIG. 2, after one or more constrained Area Groups are created and have respective (or one or more) Logic Groups assigned to them at 30, a user design is implemented by mapping, placing and routing, such as with MAP and PAR programs, at 40 to generate an initial set of guide files and to obtain an initial set of design outcomes ("results"). As guide files generation flow 40 is for creation of an initial set of guide files for a user design, another guide files generation flow is used incremental synthesis. For an implementation of an HDL synthesized design, there may be one set of guide files generated for the entire design. However, by using MAP and PAR for each Area Group, separate guide files may be generated for each Area Group. Separate sets of guide files further facilitate guiding on Area Groups and not logic instances, as described below in more detail.

Figure 4A:
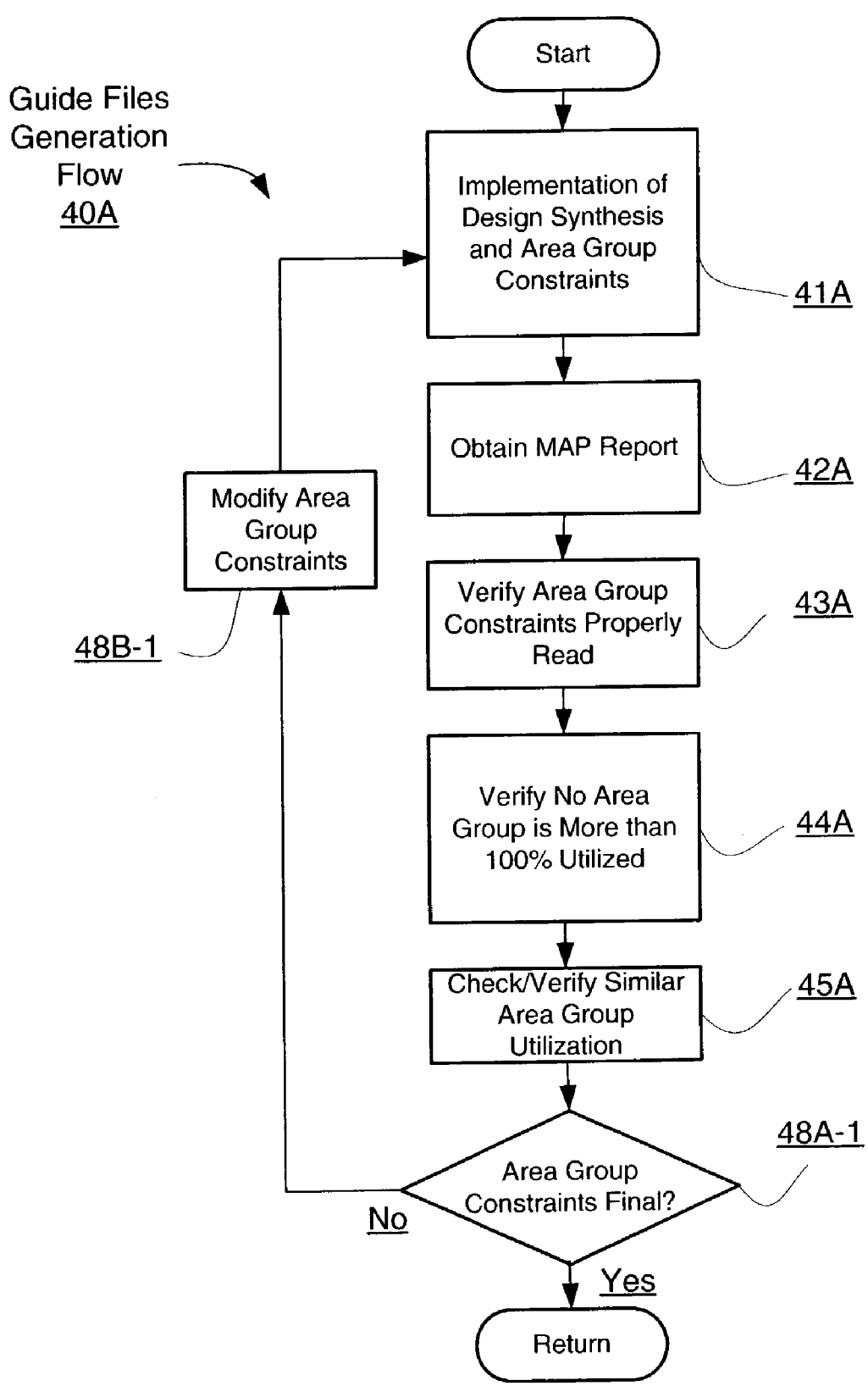
FIG. 4A is a flow diagram of an exemplary embodiment of a guide files generation flow in accordance with one or more aspects of the invention.

FIG. 4A is a flow diagram of an exemplary embodiment of a guide files generation flow 40A. At 41A, a user integrated circuit design is implemented for a device, such as an FPGA. This starts off with a design synthesis, as described above with respect to Verilog or VHDL, and, additionally, Area Groups constraints, including Logic Group membership information, from Area Group constraints output from block 35 or retrieved from storage, as input to MAP and PAR programs. Furthermore, a Logic Group includes membership information with respect to logic instances that make up the Logic Group. Accordingly, implementation is done with MAP and PAR programs using these inputs to generate an initial set of guide files. Notably, this initial set of entire design guide files does not have incremental design change but does have Logic Group membership information for each Area Group.

Optionally, at 42A a MAP report, generated from outcome of a MAP program run at 41A, may be obtained to do some verification. (A PAR report may be generated as well from outcome of a PAR program run at 41A.) Optionally, at 43A, proper reading of Area Group constraints may be verified, namely, a check is made to ensure there is a one-to-one correspondence between Logic Groups and Area Groups ensuring each Logic Group belongs to an Area Group. Optionally, at 44A, verification that no Area Group is more than 100 percent utilized may be done. Optionally, at 45A, similar utilization of Area Groups may be checked (verified) to determine if utilization is (still—if decision block 36 in FIG. 3 is done) within an acceptable distribution.

Notably, if one or more optional blocks 43A, 44A or 45A are not acceptable, then Area Group constraints generation may be revisited with Area Group generation and assignment flow 30 of FIG. 3. For example, at 48A-1, an optional check may be made as to whether Area Group constraints may be finalized. If results at 43A, 44A or 45A are not acceptable, then Area Group constraints may be modified at 48B-1, for example by re-executing all or a portion of Area Group generation and assignment flow 30 of FIG. 3 to obtain modified Area Group constraints for implementation at 41A.

Figure 4B:
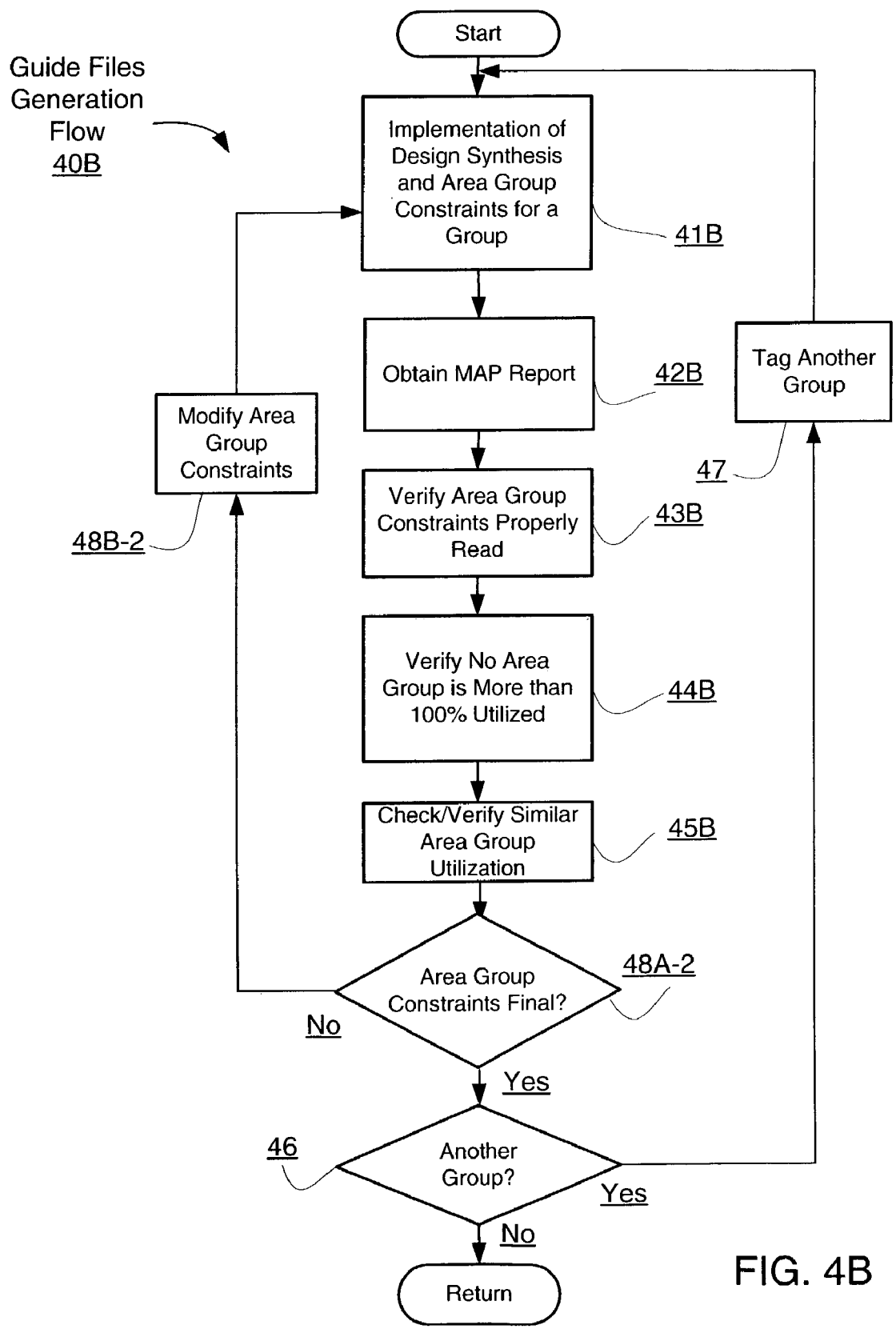
FIG. 4B is a flow diagram of another exemplary embodiment of a guide files generation flow in accordance with one or more aspects of the invention.

FIG. 4B is a flow diagram of an exemplary embodiment of a guide files generation flow 40B, where Area Groups are processed individually as opposed to processing a plurality of Area Groups at a time as in guide files generation flow 40A. However, as much of guide files generation flow 40B description is the same as in guide files generation flow 40A, redundant description is not repeated. At 41B, an Area Group, not all Area Groups, of a user integrated circuit design is implemented for a device, such as an FPGA. This starts off with a design synthesis for a Logic Group corresponding to its Area Group and, additionally, Area Group constraints, including Logic Group membership information, from Area Group constraints output from block 35 or retrieved from storage, as input to MAP and PAR programs, for such an Area Group. Accordingly, implementation is done with MAP and PAR programs using these inputs to generate an initial set of guide files for this Logic Group associated with this Area Group. Notably, this initial set of partial design guide files does not have incremental design change but does have Logic Group membership information for each Area Group. A MAP report may be obtained for such an Area Group at 42B, and optionally checks at 43B, 44B or 45B may be made as associated with such an Area Group.

At 48A-2, an optional check may be made, as to whether design results for an Area Group may be finalized. If such results are not acceptable, such an Area Group may have its constraints modified at 48B-2, such as by re-executing all or a portion of Area Group generation and assignment flow 30 of FIG. 3 for the affected Area Group, for implementation with such modified Area Group constraints at 41B.

If, however, at 48A-2 design results are acceptable, then at 46, a check is made to determine if another Logic Group is to be implemented. Notably, for a one-to-one correspondence between Logic and Area Groups, decision block 46 may be based on Logic Group or Area Group. However, if such one-to-one correspondence does not exist, then Area Group is used. If another Logic Group is to be implemented, then another Area Group, or Logic Group, is tagged or obtained at 47 for subsequent processing at 41B, as described above.

Optionally, blocks 42B, 43B, 44B or 45B do not need to be within a loop back, as consolidated reports may used, as described with FIG. 4A.

Additionally, with respect to flows 40A and 40B, Area Group constraints may be checked from outcomes of MAP program runs at design results check decision block 48 of FIG. 2, whereby blocks 48A and 48B could be omitted. Though, as mentioned above, blocks 41A and 41B are described for generating initial guide files, once initial guide files are obtained, one or more iterations for incremental design change may be used to generate one or more other sets of guide files.

With renewed reference to FIG. 2, optionally at 48, a check as to whether design results may be made final. For example, design results may be made final if no incremental design change is to be made. If design results from an implementation are acceptable, then synthesis and implementation flow 100 ends at 63.

If, however, incremental design change is to be done, then at 49 a synthesis of a design with such incremental design change ("incremental synthesis") is done. For incremental synthesis, only those Logic Groups with incremental design change have respective synthesis netlist outputs updated. For incremental synthesis, several synthesis tools may be used, such as: Leonardo Spectrum from Mentor Graphics of Wilsonville, Oreg.; FPGA Compiler II from Synopsys of Mountain View, Calif.; Synplify and Synplify Pro from Synplicity of Sunnyvale, Calif.; and Xilinx Synthesis Tool (XST) from Xilinx of San Jose, Calif.

For example, in XST, block level incremental synthesis is supported within a single project. In XST, attributes to define Logic Group boundaries are applied to each Logic Group in an XST constraints file or to hardware description language (HDL) design source code. An HDL change to a module/entity in one of a plurality of Logic Groups will only affect that changed Logic Group, namely, a synthesis netlist output for such a changed Logic Group will be written. All unchanged Logic Groups will not have their associated netlists changed, namely, unmodified portions of a design are parsed but no netlists are written. For VHDL instantiated designs, detection of modified logic is done automatically in XST. For Verilog instantiated designs, a resynthesize attribute is used.

At 50, a design with incremental design change ("revised design") is implemented with output from block 49, namely, a synthesized design with incremental design change incorporated into such synthesis.

Figure 5A:
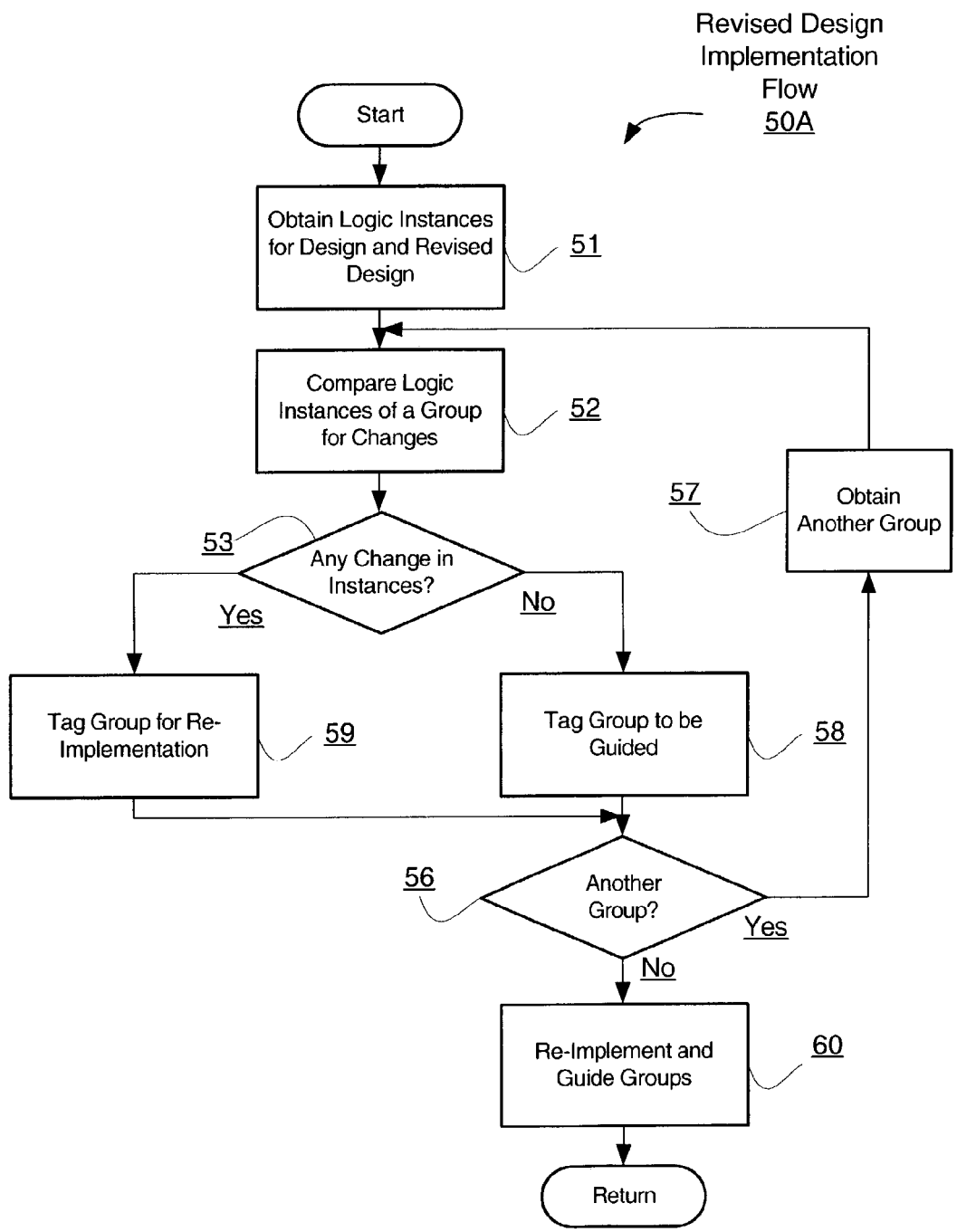
FIGS. 5A is a flow diagram of an exemplary embodiment of a revised design implementation flow in accordance with one or more aspects of the invention.
Figure 5B:
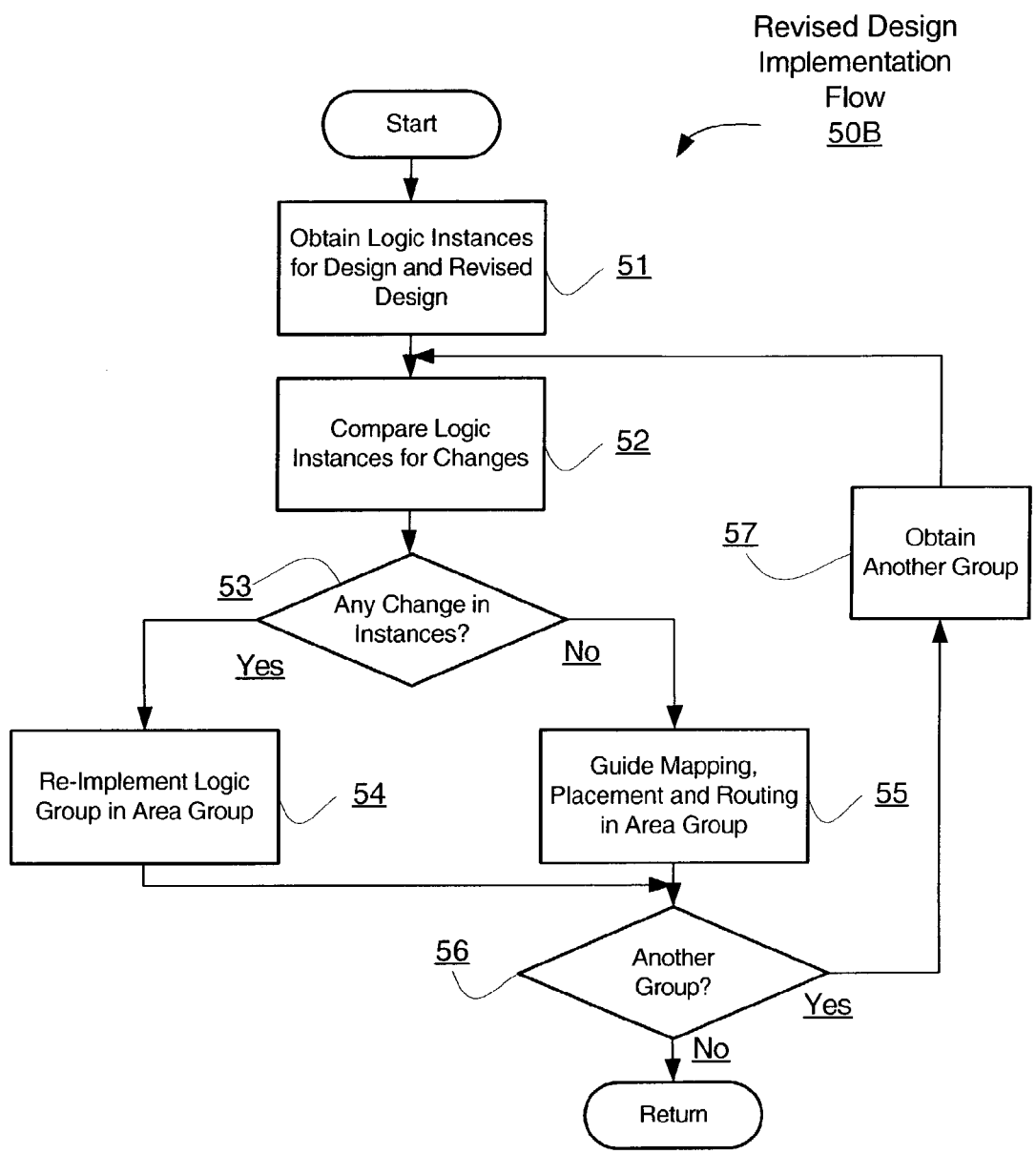
FIGS. 5B is a flow diagram of another exemplary embodiment of a revised design implementation flow in accordance with one or more aspects of the invention.

FIGS. 5A and 5B are more detailed flow diagrams of respective exemplary embodiments of revised design implementation flows 50A and 50B. With reference to FIG. 5A, at 52 logic instances for a design and a revised design of such design are obtained. In other words, design syntheses for a reference design and a revision thereof are obtained. Notably, because incremental design change as described herein may be iterative, a reference design may include incremental design change from a prior iteration. Accordingly, a Logic Group from a prior design is replaced with a modified Logic Group from an incrementally changed design, and the modified Logic Group is assigned to the same Area Group as the Logic Group as indicated in the prior design's guide file.

At 52, logic instances of a reference design and its revision are compared for changes. This may be done by calling up by Area Group or Logic Group, and then checking logic instances within a called up Group for differences. As mentioned above with respect to U.S. Pat. No. 5,867,396, by comparing netlists of the respective syntheses for differences, actual changes in circuitry, as opposed to just in name, may be identified to provide a more accurate indication of whether a Group has an incremental design change.

At 53, a determination as to whether a Group has an incremental design change is made. If revised design Logic Group or Area Group has had an incremental design change made to it as compared with a same Logic Group or Area Group, respectively, from a reference design, then at 59 such Group or its corresponding Group is tagged for re-implementation. Re-implementation, such as is done at 60 for Groups, if any, tagged for re-implementation, is a generation of incremental design results, as an Area Group is stripped of at least prior placing and routing, and may be stripped of prior mapping, placing and routing. In other words, an Area Group may be completely stripped of all prior implementation for implementation anew of logic instances of a Logic Group using a modified netlist therefor and Area Group constraints for such Area Group as input to MAP and PAR programs.

If, however, at 53, there are no changed instances, then at 58 such a Group, Area or Logic, or its corresponding Group, Logic or Area, is tagged for guiding. Notably, guide files from a reference design are used for guiding unchanged Logic Groups, if any. At 56, a check is made for another Group, Area or Logic, to be processed for tagging. If another Group is to be processed, then such other Group is obtained at 57.

If, however, all Groups have been processed at 56, then at 60 those Groups tagged for re-implementation, if any, are re-implemented and those Groups tagged for guiding, if any, are guided. Block 60 may be divided out for guiding and for re-implementing, respectively; however, available MAP and PAR tools allow for incremental modes to handle both. Additionally, it should be understood that such tools in an incremental mode will remove Logic Groups marked for re-implementation from guide files obtained for a reference implementation.

When a MAP program is run in an incremental guide mode, such a MAP program is directed to map unchanged Logic Groups as they were mapped in a reference implementation. This MAP guiding uses unchanged guide files from such reference implementation, and thus mapping results stay the same. Because each Logic Group is assigned to its own distinct area, a MAP tool can preserve mapping of unchanged Logic Groups while being able to completely re-map changed Logic Groups. As mentioned above, changed Logic Groups may be mapped anew for re-implementation.

A PAR program is run in an incremental guide mode, which uses placement and routing of all unchanged Logic Groups from a reference implementation. As mentioned above, changed Logic Groups are placed and routed anew for re-implementation. Because each Logic Group is assigned to its own distinct area, a PAR tool can preserve placement and routing of unchanged Logic Groups while being able to completely re-place and re-route changed Logic Groups.

Notably, by being able to only re-implement changed Logic Groups and keep unchanged Logic Groups as in a reference implementation, performance of an unchanged portion of a design is maintained, while improving runtime since components and signals of only changed Logic Groups are re-implemented. Furthermore, re-implementation is localized to affected Area Groups, allowing such Area Groups to be completely stripped of prior mapping, placing and routing in order to facilitate ability to optimize implementation of such affected Logic Groups.

Referring again to FIG. 2, output from MAP and PAR programs run at 50 in incremental mode is another set of guide files, namely, incremental guide files, as well as MAP and PAR report files. A PAR report file includes guide information, which may indicate which Area Groups are guided and which Area Groups are re-implemented. Notably, FIG. 5A was described in terms of a reference implementation having a set of guide files for an entire design, which may then be used to guide tagged Groups for guiding to reduce runtime. However, as mentioned with respect to FIG. 4B, separate sets of guide files may be generated for Area Groups.

Accordingly, FIG. 5B is a flow diagram of an exemplary embodiment of revised design implementation flow 50B for use with separate sets of guide files for Area Groups. As portions of revised design implementation flows 50A of FIG. 5A and 50B are the same, repetitive description is avoided for clarity.

If there are one or more changed instances at 53, then at 54, a Logic Group in an Area Group is re-implemented using an incremental mode for MAP and PAR programs. An individual set of guide files associated with such a Logic Group is obtained, along with Area Group constraints for such an Area Group, as input to MAP and PAR programs for re-implementation. This complete stripping of a prior implementation in an Area Group facilitates re-implementing a Logic Group in such an Area Group to improve performance.

If, however, there are not changed instances at 53, then at 55 a Logic Group in an Area Group is guided using an incremental guide mode for MAP and PAR programs. An individual set of guide files associated with such a Logic Group is obtained, along with Area Group constraints for such an Area Group, as input to MAP and PAR programs for guiding. By guiding, it should be understood that a prior mapping, placing and routing is used for an implementation thereby saving runtime and preserving performance of a reference implementation of unchanged Logic Groups.

At 56, a check is made for another Group to be processed. Accordingly, it should be understood that individual sets of guide files corresponding to Logic Groups is used in the exemplary embodiment of FIG. 5B.

Referring again to FIG. 2, optionally at 61, a check is made to determine if another incremental design change is to be implemented. If another incremental design change is to be done, then at 62 another incremental design change ("IDC") in an HDL is obtained for synthesis at 49. However, if at 61 no other IDC is to be implemented, then an optionally at 48, another check may be made to determine if design results are acceptable.

Accordingly, it should be understood that incremental design to significantly reduce runtime and maintain performance in unchanged portions of a design has been described. Place and route tools are able to view a design in separate Logic Groups, where each Logic Group occupies a uniquely assigned space (an area that may extend to one or more semiconductor process levels) on a device. When a Logic Group is changed, these tools can completely re-place and re-route that Logic Group inside of its assigned space. Having an assigned space, which is open for complete re-placement and re-routing, allows place and route tools to have many degrees of freedom to facilitate working toward improving performance, including an optimal configuration for a changed Logic Group.

Above, a one-to-one correspondence between Logic Groups and Area Groups was described. However, each Logic Group need not be assigned its own Area Group, but this can increase runtime due to having to implement around implementations of guided Logic Groups. In addition to having each Logic Group assigned its own Area Group, other Logic Group guidelines are:

All logic for a circuit, except I/O logic and clock logic, should be part of a Logic Group.

Avoid ungrouped logic.

Notably, all the above guidelines are just that, namely, they are not always to be followed. For example, there may be instances where having ungrouped logic locked down outside of designated Area Groups is desirable.

An incremental design flow has been described where runtime is significantly improved while maintaining performance of unchanged Logic Groups by assigning each Logic Group to an Area Group. Mapping, placing and routing is unchanged for unchanged Logic Groups, while re-mapping, re-placing and re-routing is done for one or more changed Logic Groups.

Though an FPGA device has been described for purposes of clarity, it should be appreciated that the above-description is not limited to FPGA devices but includes any sufficiently complex integrated circuit implemented iteratively implemented. A precursor for such implementation may be use of one or more synthesis tools, schematics, high-level language compilers, and the like for providing one or more Logic Groups for implementation. Furthermore, though use for incremental design for debugging has been described, it should be appreciated that design operations other than debugging are applicable. For example, basic design of one or more logic sections may be done using one or more corresponding Area Groups.

Figure 6:
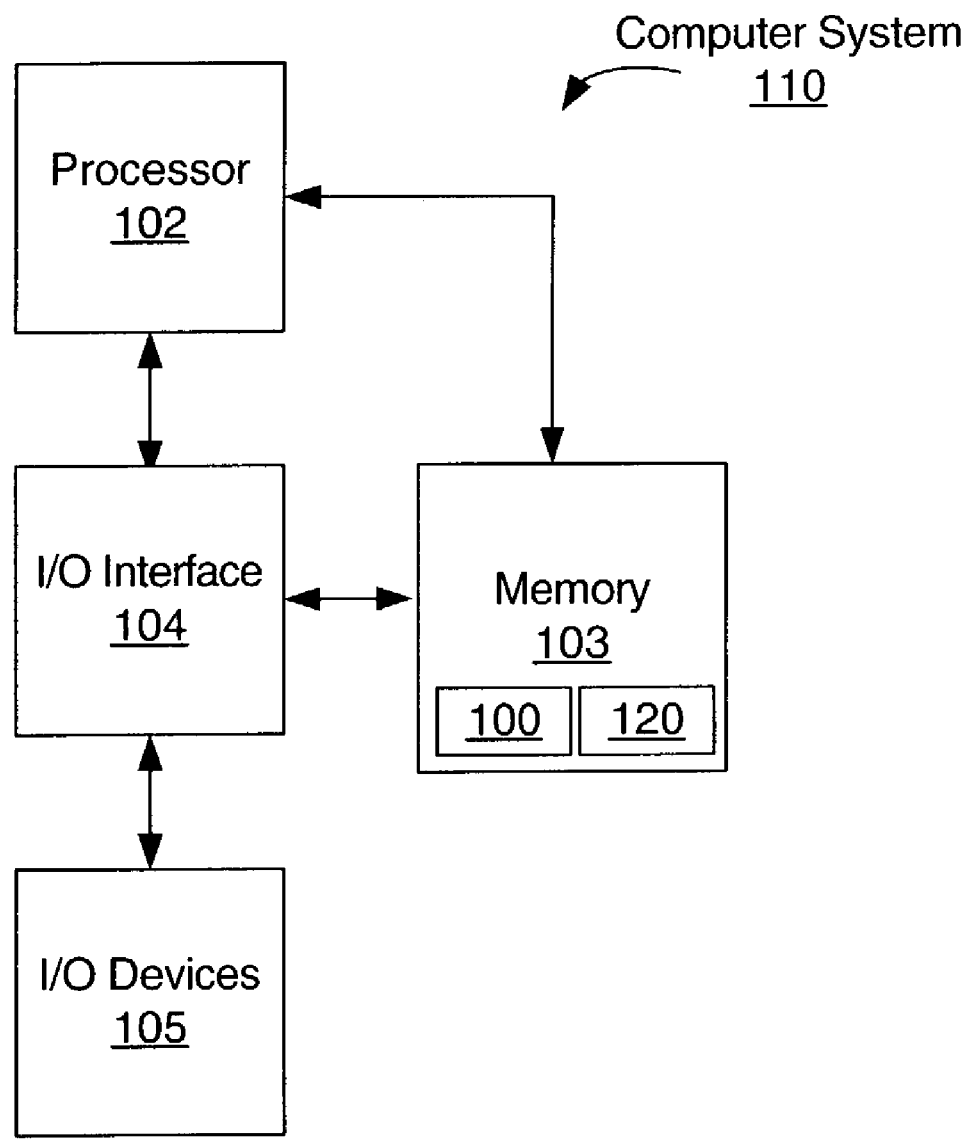
FIG. 6 is a block diagram of an exemplary embodiment of a computer system that may programmed with one or more program products for the synthesis and implementation flow of FIG. 2 in accordance with one or more aspects of the invention.

FIG. 6 is a block diagram of an exemplary embodiment of a computer system 110 that may programmed with one or more program products of synthesis and implementation flow 100 in accordance with one or more aspects of the invention. Computer system 110 may be implemented using configured personal computers, workstation computers, mini computers, mainframe computers, or a distributed network of computers. For purposes of clarity, a personal computer system 110 is described below though other computer systems may be used. Computer system 110 is configured with at least one of the following: processor 102, I/O interface 104, and memory 103. Additionally, one or more I/O devices 105, such as keyboards, displays, cursor pointing devices, and the like may be coupled to I/O interface 104. Furthermore, I/O interface 104 may be coupled to a network for access to information.

Computer system 110 is programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in memory 103. Memory 103 may include one or more of the following random access memory, read only memory, magneto-resistive read/write memory, optical read/write memory, cache memory, magnetic read/write memory, and the like.

As will be described in detail below, an aspect of the invention is implemented as a program product for use with a computer system such as, for example, computer system 110, where computer system 110 may be programmed with one or more of synthesis, MAP and PAR tools. Program(s) of the program product defines functions of embodiments and can be contained on a variety of signal/bearing media, which include, but are not limited to: (i) information permanently stored on non-writable storage media (e.g., read-only memory devices within a computer such as CD-ROM or DVD-RAM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

In addition to having one or more portions of synthesis and implementation flow 100 in memory 103, memory 103 may store a database 120 sets of guide files for each Area Group. Thus, rather than checking each set of guide files, when a change is made to a Logic Group it can be tagged such that changed and unchanged guide files can be easily identified. Accordingly, in FIG. 5B, decision block 53 may be avoided, and decision block 56 would be based on changed files. Additionally, block 55 may be omitted, a prior implementation of an Area Group, which would have been guided, is used. This avoids having to guide unchanged Area Groups.

Another embodiment of the invention (see Appendix A, which is herein incorporated by reference in its entirety) includes a method for incrementally modifying a circuit design on an integrated circuit. The method includes determining one or more logic groups, where a logic group has a hardware description language (HDL) description of at least a portion of the circuit design. Next one or more area groups are created, where an area group identifies a physical area on the integrated circuit. The logic group is assigned to an area group. Lastly, the logic group is replaced with a modified logic group (i.e., re-designed logic group); wherein the modified logic group is assigned the same area group.

An example of an integrated circuit is a FPGA. Logic groups in this embodiment are HDL parts of the circuit design that can be synthesized separately. Examples of logic groups include Verilog modules or VHDL entities instantiated at the top level. Each logic group is assigned an area group, where each area group is associated with a non-overlapping physical area on the FPGA.

In this embodiment, the HDL for the circuit design is synthesized using the logic groups. Next, non-overlapping physical areas identified by area groups are reserved on the FPGA. Then, each logic group is assigned an area group. Each logic group is placed and routed in its reserved physical area as identified by its associated area group. When there is a design change, the appropriate modified logic group(s) is identified. The modified logic group(s) is re-synthesized. Using the same area group(s) associated with the unmodified logic group(s), this area group(s) is re-placed and re-routed. The other logic groups, which were not modified, keep their placement and routing. Thus the performance of the unchanged design is kept, while place and route time is reduced because only the area group(s) associated with the modified logic group(s) need be re-placed and re-routed.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps.

The invention claimed is:

1. A processor-implemented method for implementing a circuit design, comprising:
   assigning portions of a first version of a circuit design to a plurality of areas of an integrated circuit, wherein each portion is assigned to one of the areas;
   generating respective netlists for the portions of the first version of the circuit design;
   implementing the first version of the circuit from the netlists;
   inputting netlists representing a second version of the circuit design, wherein portions of the second version of the circuit design correspond to the portions of the first version and are assigned to areas of the integrated circuit to which the portions of the first version are assigned;

for each of the plurality of areas, comparing a first netlist of a portion of the first version of the circuit design assigned to the area to a corresponding second netlist of the portion of the second version of the circuit design;

implementing, in place of an implementation of the first netlist, the second netlist of the second version of the design in response to the second netlist being not equal to the first netlist; and bypassing implementing the second netlist in response to the second netlist being equal to the first netlist.

2. The method of claim 1, further comprising:

determining for each of the plurality of areas of the integrated circuit, utilization by the assigned portions of the first version of the circuit design;

changing an assignment of at least one portion of the first version of the circuit design from a first area to a second area in response to the utilization of the second area being outside a range.

3. The method of claim 1, further comprising:

for a first area of the plurality of areas having a first plurality of assigned portions of the first version of the design, comparing netlists of the first plurality of assigned portions of the first version to corresponding netlists of the second version of the design; and in response to at least one of the netlists of the first plurality of assigned portions of the first version being not equal to a corresponding at least one of the netlists of the second version of the design, implementing the corresponding netlists of the second version of the design in place of an implementation of the netlists of the first plurality of portions of the first version of the design.

4. The method of claim 1, wherein the step of implementing the first version of the circuit and the step of implementing the second netlist include mapping the circuit design to resources of a programmable logic device.

5. The method of claim 1, wherein the programmable logic device is a field programmable logic device.

6. A apparatus for implementing a circuit design, comprising:

means for assigning portions of a first version of a circuit design to a plurality of areas of an integrated circuit, wherein each portion is assigned to one of the areas;

means for generating respective netlists for the portions of the first version of the circuit design;

means for implementing the first version of the circuit from the netlists;

means for inputting netlists representing a second version of the circuit design, wherein portions of the second version of the circuit design correspond to the portions of the first version and are assigned to areas of the integrated circuit to which the portions of the first version are assigned;

means for comparing, for each of the plurality of areas, a first netlist of a portion of the first version of the circuit design assigned to the area to a corresponding second netlist of the portion of the second version of the circuit design;

means for implementing, in place of an implementation of the first netlist, the second netlist of the second version of the design in response to the second netlist being not equal to the first netlist; and means for bypassing implementing the second netlist in response to the second netlist being equal to the first netlist.

7. An article of manufacture, comprising:

a processor-readable medium having instructions executable by at least one processor for implementing a circuit design by performing the steps of, assigning portions of a first version of a circuit design to a plurality of areas of an integrated circuit, wherein each portion is assigned to one of the areas;

generating respective netlists for the portions of the first version of the circuit design;

implementing the first version of the circuit from the netlists;

inputting netlists representing a second version of the circuit design, wherein portions of the second version of the circuit design correspond to the portions of the first version and are assigned to areas of the integrated circuit to which the portions of the first version are assigned;

for each of the plurality of areas, comparing a first netlist of a portion of the first version of the circuit design assigned to the area to a corresponding second netlist of the portion of the second version of the circuit design;

implementing, in place of an implementation of the first netlist, the second netlist of the second version of the design in response to the second netlist being not equal to the first netlist; and bypassing implementing the second netlist in response to the second netlist being equal to the first netlist.

8. The article of manufacture of claim 7, wherein the processor-readable medium is further configured with executable instructions for performing the steps comprising:

determining for each of the plurality of areas of the integrated circuit, utilization by the assigned portions of the first version of the circuit design;

changing an assignment of at least one portion of the first version of the circuit design from a first area to a second area in response to the utilization of the second area being outside a range.

9. The article of manufacture of claim 7, wherein the processor-readable medium is further configured with executable instructions for performing the steps comprising:

for a first area of the plurality of areas having a first plurality of assigned portions of the first version of the design, comparing netlists of the first plurality of assigned portions of the first version to corresponding netlists of the second version of the design; and in response to at least one of the netlists of the first plurality of assigned portions of the first version being not equal to a corresponding at least one of the netlists of the second version of the design, implementing the corresponding netlists of the second version of the design in place of an implementation of the netlists of the first plurality of portions of the first version of the design.

10. The article of manufacture of claim 7, wherein the instructions for implementing the first version of the circuit and the instructions for implementing the second netlist include instructions for mapping the circuit design to resources of a programmable logic device.

11. The method of claim 10, wherein the programmable logic device is a field programmable logic device.

* * * * *